(12) United States Patent
Aoyama et al.

(10) Patent No.: US 7,129,798 B2
(45) Date of Patent: Oct. 31, 2006

(54) OSCILLATOR CIRCUIT HAVING STABLE FREQUENCY

(75) Inventors: Seiki Aoyama, Toyohashi (JP); Toshikazu Itakura, Toyota (JP)

(73) Assignee: Denso Corporation, Kariya (JP)

(*) Notice: Subject to any disclaimer, the term of this patent is extended or adjusted under 35 U.S.C. 154(b) by 5 days.

(21) Appl. No.: 10/678,132

(22) Filed: Oct. 6, 2003

(65) Prior Publication Data

US 2004/0075507 A1 Apr. 22, 2004

(30) Foreign Application Priority Data

Oct. 21, 2002 (JP) ............................ 2002-306085

(51) Int. Cl.
*H03B 5/20* (2006.01)

(52) U.S. Cl. .................. 331/135; 331/143; 331/57; 331/176

(58) Field of Classification Search ............... 331/135, 331/143, 57, 176
See application file for complete search history.

(56) References Cited

U.S. PATENT DOCUMENTS

| 5,134,371 A | 7/1992 | Watanabe et al. ........... 324/252 |
| 5,180,995 A | 1/1993 | Hayashi et al. ............... 331/57 |
| 5,485,429 A * | 1/1996 | Ono ............................ 365/222 |
| 2002/0000889 A1 * | 1/2002 | Kim ............................ 331/143 |
| 2003/0184395 A1 * | 10/2003 | Nagatomo ................... 331/135 |

FOREIGN PATENT DOCUMENTS

| JP | U-54-181853 | 12/1979 |
| JP | A-58-17723 | 2/1983 |
| JP | A-H01-236704 | 9/1989 |
| JP | A-H05-304417 | 11/1993 |
| JP | A-6-338721 | 12/1994 |
| JP | A-2000-106521 | 4/2000 |
| JP | A-2001-102866 | 4/2001 |

OTHER PUBLICATIONS

Notification of Reason(s) for Refusal issued from Japanese Patent Office issued on Oct. 18, 2005 for the corresponding Japanese patent application No. JP-2002-306085 (a copy and English translation thereof).

* cited by examiner

*Primary Examiner*—Joseph Chang
(74) *Attorney, Agent, or Firm*—Posz Law Group, PLC

(57) ABSTRACT

An oscillator includes first, second and third inverters (1, 2, 3) connected in series. A feedback path is connected from the output terminal of the third inverter (3) to the input terminal of the first inverter 1 through a resistor (5) while a second feedback path is connected from the output terminal of the second inverter (2) to the input terminal of the first inverter (1) through a capacitor (4). The second feedback path further includes a resistor (6) having a temperature coefficient larger than that of resistor (5) is inserted to adjust the charge/discharge trigger voltage and charge/discharge time of the capacitor (4).

12 Claims, 11 Drawing Sheets

<HIGH TEMPERATURE>

FIG. 17

<LOW TEMPERATURE>

OSCILLATOR CIRCUIT HAVING STABLE FREQUENCY

CROSS REFERENCE TO RELATED APPLICATIONS

This application is based upon, claims the benefit of priority of, and incorporates by reference the contents of Japanese Patent Application No. 2002-306085 filed Oct. 21, 2002.

FIELD OF THE INVENTION

The present invention relates generally to an oscillator circuit and, more particular, to an oscillator circuit composed of semiconductor elements.

BACKGROUND OF THE INVENTION

Figure 18:
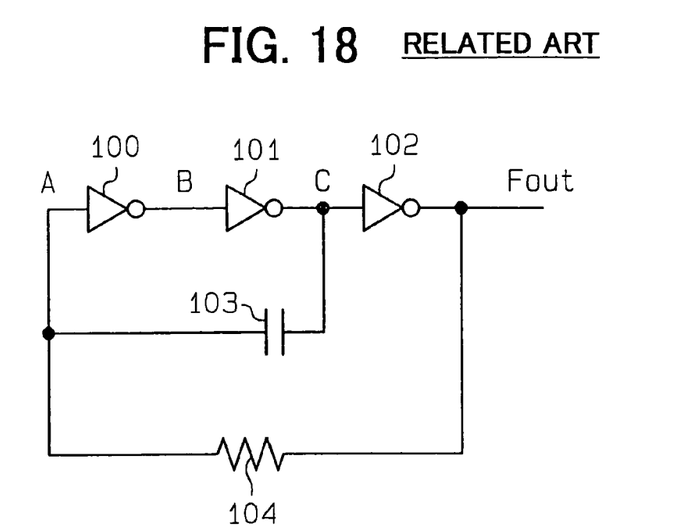
FIG. 18 is a schematic circuit diagram of a related art oscillator circuit.
Figure 19:
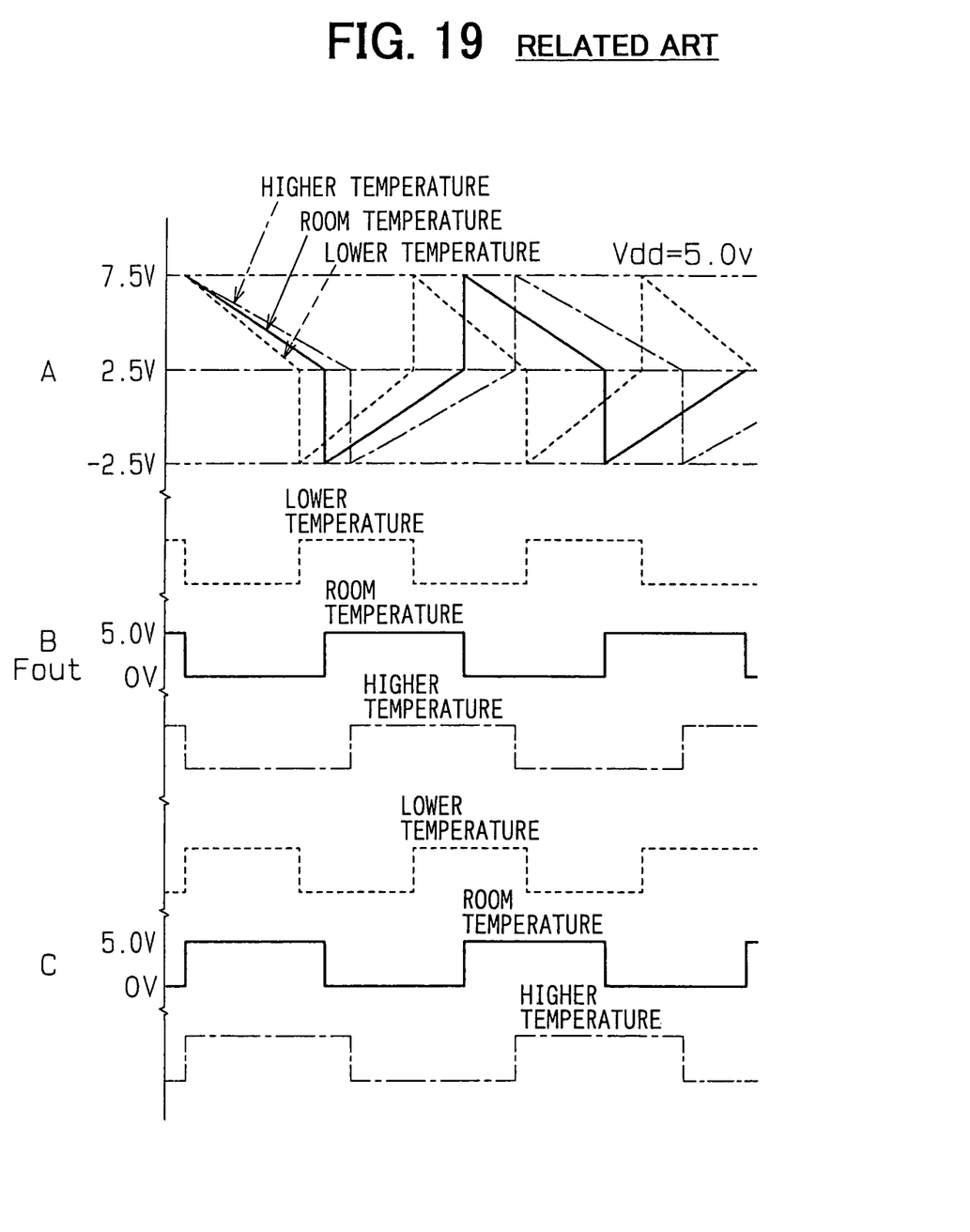
FIG. 19 is a schematic diagram illustrating waveforms of various points for the oscillator circuit of FIG. 18.

Referring to FIG. 18, an oscillator circuit may include inverters 100, 101, 102 connected in series and in which the output of the inverter 101 and the input of the inverter 100 are connected via a capacitor 103. The output of the inverter 102 and the input of the inverter 100 are connected via a resistor 104. FIG. 19 shows waveforms of the input of the inverter 100 (A), the output of the inverter 100 (B), the output of the inverter 102 (Fout), and the output of the inverter 101 (C) at the room temperature, as the solid line.

The oscillation frequency f1 may be determined by the time constant of the charge/discharge of resistor 104 and capacitor 103, and the value of f1 may be given by the following equation for the resistance R11 of the resistor 104 and the capacitance C11 of the capacitor 103:

$f1=1/(k \cdot R11 \cdot C11)$, in which k is a constant have a value of approximately 2.2.

When the oscillator is composed of semiconductor elements, the resistor 104 may be made from a diffused resistor or a polysilicon resistor, and the capacitor 103 may be made from a polysilicon interlayer film or a gate oxide film.

The temperature dependency (temperature characteristics) of the resistor 104 may be the primary factor affecting the temperature dependency (temperature characteristics) with respect to the oscillation frequency for the time constant of the charging/discharging determined by the resistor 104 and the capacitor 103. The value may vary in the range of 10 to 40% when using the diffusion resistor (in a ratio of 125° C./room temperature) or in the range of 4 to 10% when using the polysilicon resistor. More specifically, when using a resistor 104 having a smaller temperature coefficient and an interlayer film capacitor as the capacitor 103, displacement will occur at temperatures lower or higher than room temperature. This is illustrated in FIG. 19 by the dotted line and dashed line respectively. The oscillation frequency will have the temperature dependency due to the temperature dependency (temperature characteristics) of the resistor.

When a system requires a higher precision oscillation frequency, an oscillator such as crystals and ceramics is used. However, the materials and implementation of such external parts will result in an inevitable augmentation of manufacturing cost.

Figure 20:
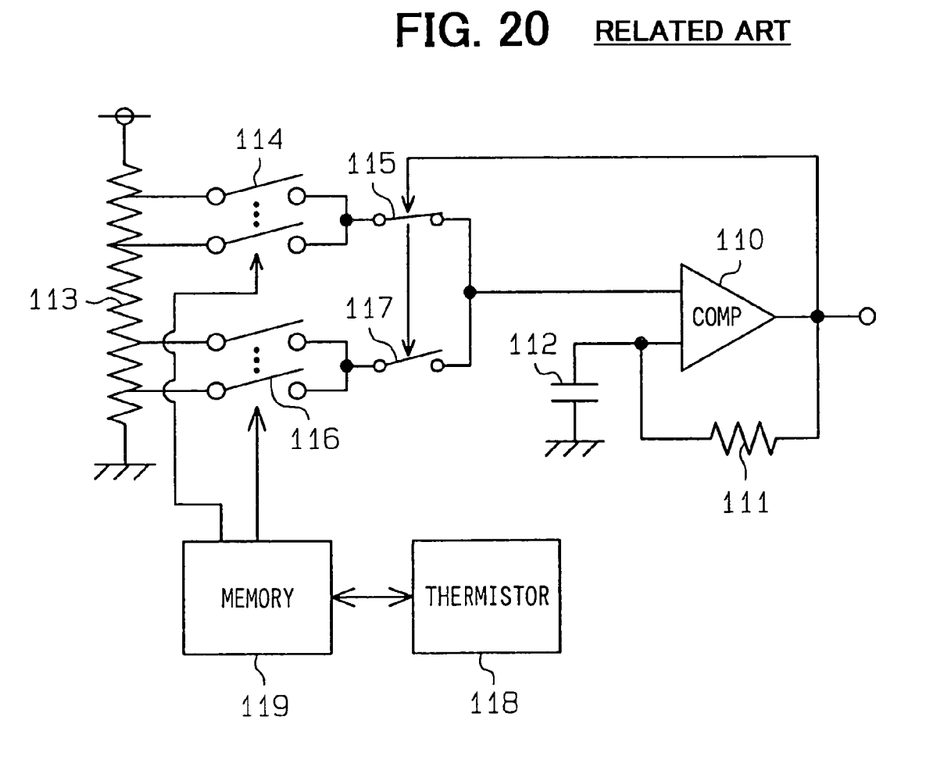
FIG. 20 is a schematic circuit diagram of a related art oscillator circuit.

A circuit design as shown in FIG. 20 is conceivable for stably controlling a frequency on a semiconductor chip. In this circuit design, one of the input terminals of the comparator 110 is fed back through a CR circuit of a resistor 111 and a capacitor 112. The other input terminal of the comparator 110 is connected to a node in a resistor 113 (dividing node) through a first group of switches 114 and a first switch 115, and is also connected to another node in a resistor 113 (dividing node) through a second group of switches 116 and a second switch 117. The first and second switches 115 and 117 are alternately turned on and off in response to the output from the comparator 110. The circuit design also includes a thermistor 118 and a memory 119. The memory 119 will turn on a predetermined switch among the first and second groups of switches 114 and 116 in accordance with the result of a temperature measured by the thermistor 118. More particularly, the memory 119 will selectively turn on any one of the switches among the first group of switches 114, and any one of the switches among the second group of switches 116. The input terminal of the comparator 110 will be applied with an appropriate threshold voltage corresponding to the temperature. Generally, based on the output of the thermistor 118 and the signals from the appropriately preprogrammed memory 119, the threshold voltage of the comparator 110 that determines the oscillation frequency will be adjusted to control the frequency so that it is stable.

However, this circuit design has the drawback of a control circuit section requiring a large area, which leads to an increase in associated cost.

SUMMARY OF THE INVENTION

The present invention has been made in view of the above circumstances and has an object to overcome the above problems and to provide an oscillator circuit which allows the temperature dependency to be improved with respect to a given oscillation frequency with a simpler circuit design.

The oscillator circuit includes a first resistor having a temperature coefficient larger than the temperature coefficient of another resistor constituting a CR circuit. The first resistor is used for adjusting the charging/discharging trigger voltage and charging/discharging time of a capacitor of the CR circuit. Utilization of a resistor such as the first resistor that has a temperature coefficient larger than the temperature coefficient of the resistor constituting the CR circuit adjusts the charging/discharging trigger voltage and charging/discharging time of the capacitor of the CR circuit and also improves the temperature dependency with respect to the oscillation frequency with a simple circuit design.

The first resistor may be inserted into a feedback path from an output terminal of even number inverters among a group of inverters through the capacitor to an input terminal of the first inverter. The first resistor has a temperature coefficient larger than the temperature coefficient of another resistor from the output terminal of the uneven number inverters. Adjusting this design permits further improvement in the charging/discharging trigger voltage and charging/discharging time of the capacitor, the temperature dependency with respect to the oscillation frequency with a simple circuit design.

A number of resistors among a plurality of resistors used as divider may also have a temperature coefficient larger than the temperature coefficient of another dividing resistor and of the resistor composing the CR circuit. Adjusting this design further permits an improvement in the charging/discharging trigger voltage and charging/discharging time of the capacitor, the temperature dependency with respect to the oscillation frequency with a simple circuit design.

The resistor may be a semiconductor resistor element. The density of impurity in the semiconductor resistor element may be changed in order to vary the temperature coefficient of the resistor. The semiconductor resistor element is preferably composed of impurity doped polysilicon or a diffusion resistor. The CR circuit may be integrated on a single chip.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

DETAILED DESCRIPTION OF THE PREFERRED EMBODIMENTS

The following description of the preferred embodiment(s) is merely exemplary in nature and is in no way intended to limit the invention, its application, or uses.

[First Embodiment]

A first preferred embodiment, which embodies the present invention, will be described herein below in greater details with reference to accompanying drawings.

Figure 1:
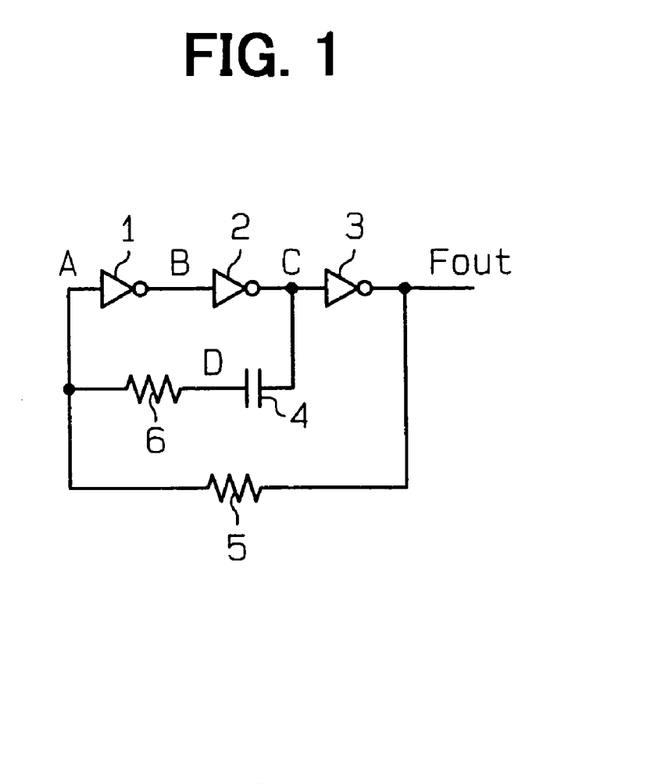
FIG. 1 is a circuit diagram of an oscillator in accordance with a first preferred embodiment of the present invention.

Referring to FIG. 1, a schematic diagram of an oscillator circuit in accordance with a first preferred embodiment of the present invention is shown. The oscillator circuit in accordance with the preferred embodiment is preferably embodied within a single integrated circuit. The oscillator circuit includes inverters 1, 2, and 3 connected in series. Between the output of the inverter 2 and the input of the inverter 1, a capacitor 4 and a resistor 6 are connected in series. The output of the inverter 3 and the input of the inverter 1 are connected via a resistor 5.

Figure 2:
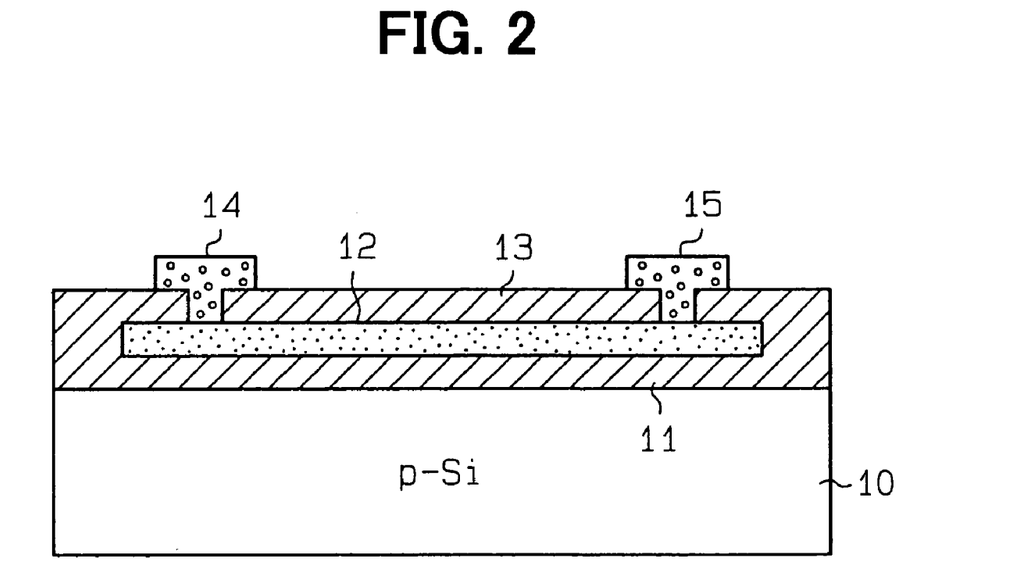
FIG. 2 is a vertical cross sectional view illustrating an impurity doped polysilicon resistor.
Figure 3:
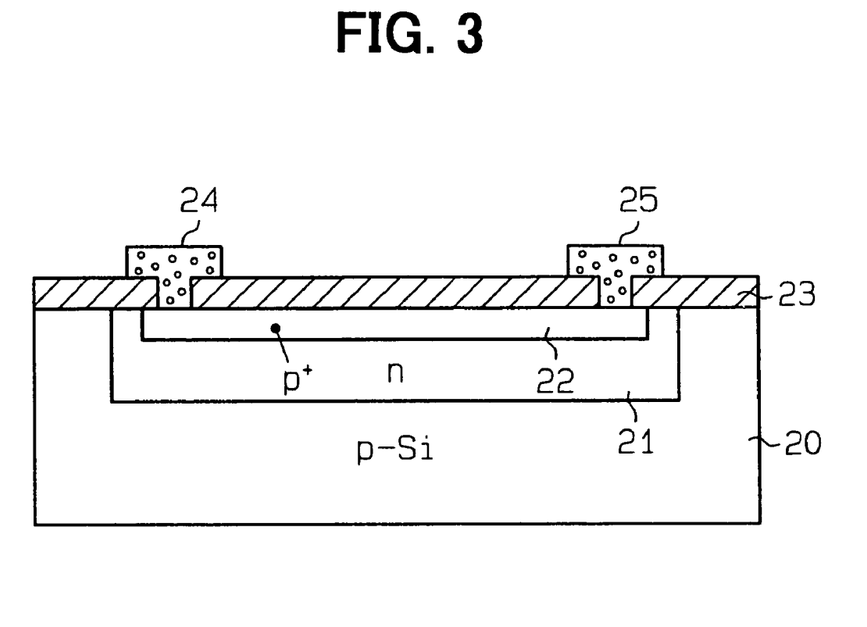
FIG. 3 is a vertical cross sectional view illustrating a p$^+$-type diffused resistor.

The resistors 5 and 6 in FIG. 1 may be impurity doped polysilicon resistors as shown in FIG. 2 or diffused resistors as shown in FIG. 3.

Referring to FIG. 2, a semiconductor element that may implement the resistor 5 (or first resistor) or resistor 6 (or second resistor) will be discussed. The semiconductor element includes an impurity doped polysilicon layer (polysilicon layer) 12 deposited on a p-type silicon substrate 10 with a silicon oxide layer 11 interposed therebetween. Aluminum wirings 14 and 15 are deposited on the polysilicon layer 12 with another silicon oxide layer 13 interposed therebetween. The aluminum wiring 14 is electrically connected to an end of the impurity doped polysilicon layer 12 through a contact hole while the aluminium wiring 15 is electrically connected to another end of the impurity doped polysilicon layer 12 through another contact hole.

Referring FIG. 3, another semiconductor element that may implement the resistor 5 (or first resistor) or resistor 6 (or second resistor) will be discussed. This semiconductor element includes a p-type silicon substrate 20 on the surface of which is formed an n-type domain 21. A p$^+$-type domain 22 is formed on the surface of the n-type domain 21. A silicon oxide layer 23 and aluminum wirings 24 and 25 are deposited on the p-type silicon substrate 20. A first aluminum wiring 24 is electrically connected to an end of the p$^+$-type domain 22 through a contact hole while a second aluminum wiring 25 is electrically connected to another end of the p$^+$-type domain 22 through another contact hole.

The impurity doped polysilicon resistor shown in FIG. 2 may be used for the resistor 5 of FIG. 1 (first resistor), and the p$^+$-type diffused resistor shown in FIG. 3 may be used for the resistor 6 of FIG. 1 (second resistor).

Figure 4:
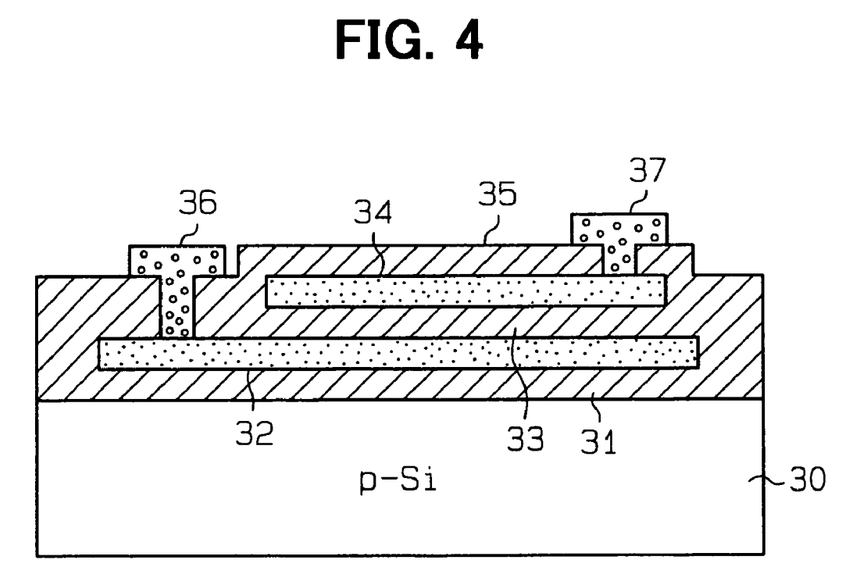
FIG. 4 is a vertical cross sectional view illustrating a capacitor.

The capacitor 4 of FIG. 1 may be implemented by the semiconductor element shown in FIG. 4. This semiconductor element includes a first polysilicon layer 32 deposited on a p-type silicon substrate 30 with a silicon oxide layer 31 interposed therebetween. A second polysilicon layer 34 is deposited thereon with a silicon oxide layer 33 interposed between the second polysilicon layer 34 and the first polysilicon layer. The underlying first polysilicon layer 32 and the second polysilicon layer 34 are formed so as to be opposed (or lying over) to one another across the silicon oxide layer 33. A silicon oxide layer 35 and aluminium wirings 36 and 37 are formed on the polysilicon layer 34. The aluminum wiring 36 is electrically connected to the polysilicon layer 32 through a contact hole while the aluminium wiring 37 is electrically connected to the polysilicon layer 34 through a contact hole.

As described above, the capacitor 4 of FIG. 1 utilizes polysilicon interlayer film as shown in FIG. 4.

As mentioned above, the resistor 5 of FIG. 1 (first resistor) may be implemented by the impurity doped polysilicon resistor shown in FIG. 2 and the resistor 6 of FIG. 1 (second resistor) may be implemented by the p$^+$-type diffused resistor shown in FIG. 3. However, other designs may be used, some of which will be described below.

Figure 5:
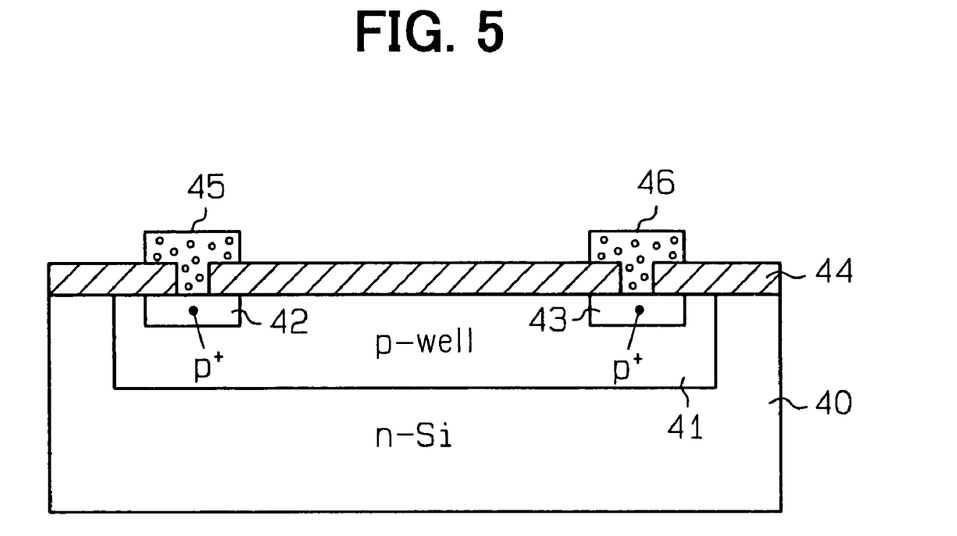
FIG. 5 is a vertical cross sectional view illustrating a p-type well diffused resistor.

First, the impurity doped polysilicon resistor shown in FIG. 2 may be used to implement the resistor 5 of FIG. 1 (first resistor) and a p-type well diffused resistor shown in FIG. 5 may be used to implement the resistor 6 (second resistor) of FIG. 1. Referring specifically to FIG. 5, the p-type well diffused resistor includes an n-type silicon substrate 40 on the surface of which is formed a p-type well domain 41. On the surface of the p-type well domain 41, spaced apart p⁺-type domains 42 and 43 are formed. On the n-type silicon substrate 40, a silicon oxide layer 44 is formed and aluminum wirings 45 and 46 are formed thereon. The aluminum wiring 45 is electrically connected to the p⁺-type domains 42 through a contact hole while the aluminium wiring 46 is electrically connected to the p⁺-type domains 43 through another contact hole.

Figure 6:
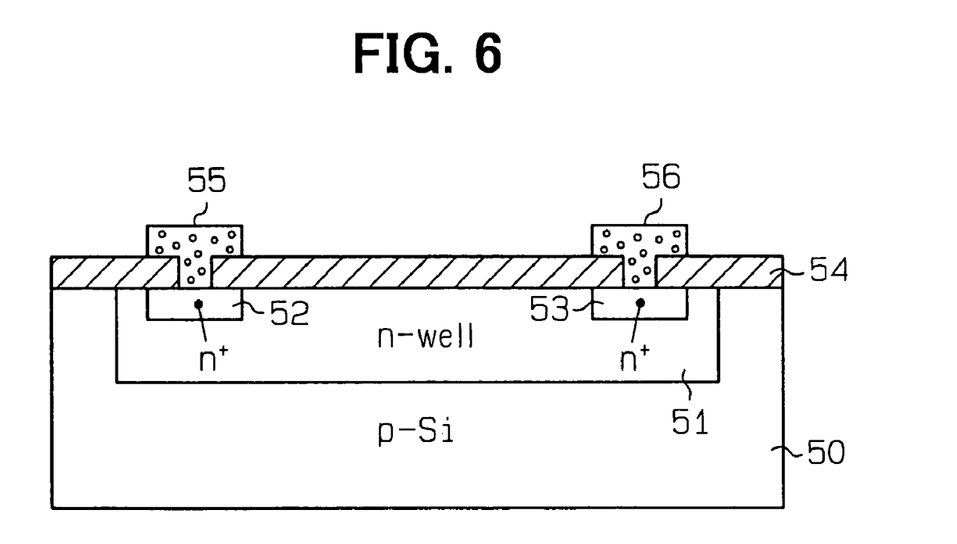
FIG. 6 is a vertical cross sectional view illustrating an n-type well diffused resistor.

Second, the p⁺-type diffused resistor shown in FIG. 3 may be used to implement the resistor 5 of FIG. 1 (first resistor) and the p-type well diffused resistor shown in FIG. 5 may be used to implement the resistor 6 of FIG. 1 (second resistor). However, an n-type well diffused resistor shown in FIG. 6 may alternatively be used rather than the p-type well diffused resistor shown in FIG. 5. Referring to FIG. 6, the n-type well diffused resistor includes a p-type silicon oxide layer 50, on the surface of which is formed an n-type well domain 51. Two n⁺-type domains 52 and 53 are formed spaced apart on the n-type well domain 51. On the p-type silicon oxide layer 50 aluminum wirings 55 and 56 are formed thereon with a silicon oxide layer 54 interposed therebetween. The aluminum wiring 55 may be electrically connected to the n⁺-type domain 52 through a contact hole, while the aluminium wiring 56 is electrically connected to the n⁺-type domain 53 through another contact hole.

Figure 7:
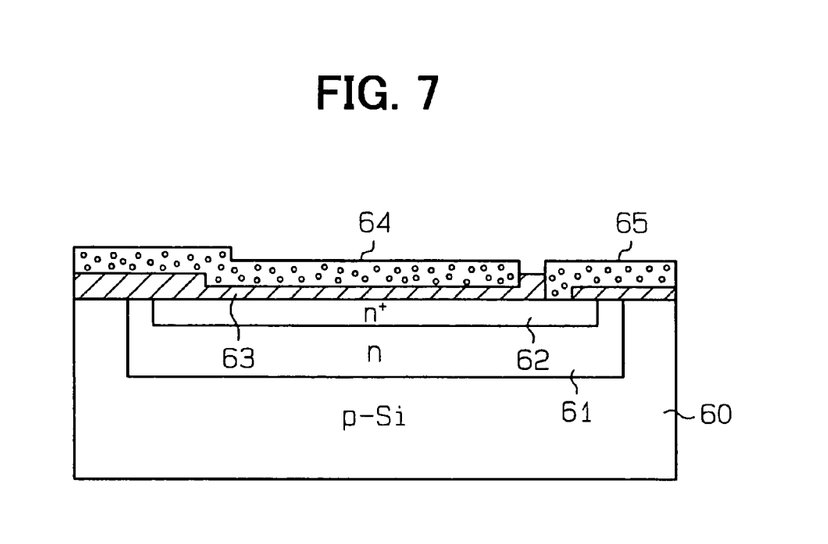
FIG. 7 is a vertical cross sectional view illustrating a capacitor.

Although the capacitor 4 shown in FIG. 1 was described above as being implemented by the silicon oxide layer 33 sandwiched between the polysilicon films 32 and 34 as shown in FIG. 4, a thin film silicon oxide layer 63 shown in FIG. 7 may alternatively be used. Referring to FIG. 7, an n-type domain 61 is formed on a p-type silicon substrate 60. An n⁺-type domain 62 is formed on the n-type domain 61 surface. On the p-type silicon substrate 60, aluminum wirings 64 and 65 are formed with a thin film silicon oxide layer 63 interposed. Across the thin film silicon oxide layer 63 n⁺-type domain (first electrode) 62 and aluminium wiring (second electrode) 64 are opposed. The aluminium wirings 65 are electrically connected to the n⁺-type domain 62 through a contact hole.

Figure 8:
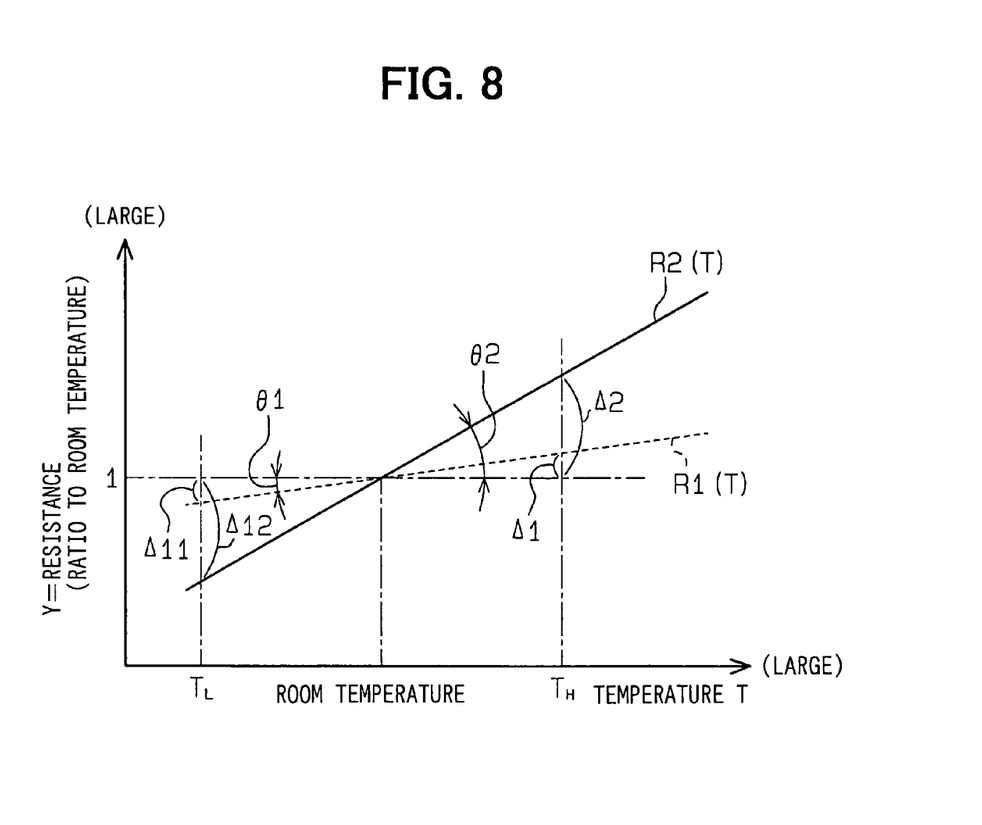
FIG. 8 is a schematic diagram illustrating the temperature characteristics.

Referring to FIG. 8, first temperature characteristics R1 (T) of the first resistor 5 shown in FIG. 1 and second temperature characteristics R2 (T) of the second resistor 6 of FIG. 1 are shown. FIG. 8 has its abscissa for temperature T, and its ordinate for the resistance. The resistance inordinate is indicated as the ratio to the room temperature, so that the value will become "1" at room temperature.

In FIG. 8 the temperature characteristics R1 (T) of the first resistor 5, i.e., the resistance at various temperature is indicated by a dotted line, while the temperature characteristics R2 (T) of the second resistor 6, i.e., the resistance at various temperature is indicated by a solid line. The temperature characteristics R1 (T) and temperature characteristics R2 (T) are both linear functions having positive, but different gradients θ1 and θ2. More specifically, the gradient (temperature coefficient) θ2 of the temperature characteristics R2 (T) of the resistor 6 is larger than the gradient (temperature coefficient) θ1 of the temperature characteristics R1 (T) of the resistor 5 (θ2>θ1). Thus, at a higher temperature TH, the resistance R1 is larger by Δ1 than when in room temperature, and the resistance R2 is larger by Δ2, as well as Δ2 is larger than Δ1 (Δ2>Δ1). On the other hand at a lower temperature T1 the resistance R1 is smaller by Δ11 than at room temperature, and the resistance R2 is smaller by Δ12, as well as Δ12 is larger than Δ11 (Δ12>Δ11).

Figure 9A:
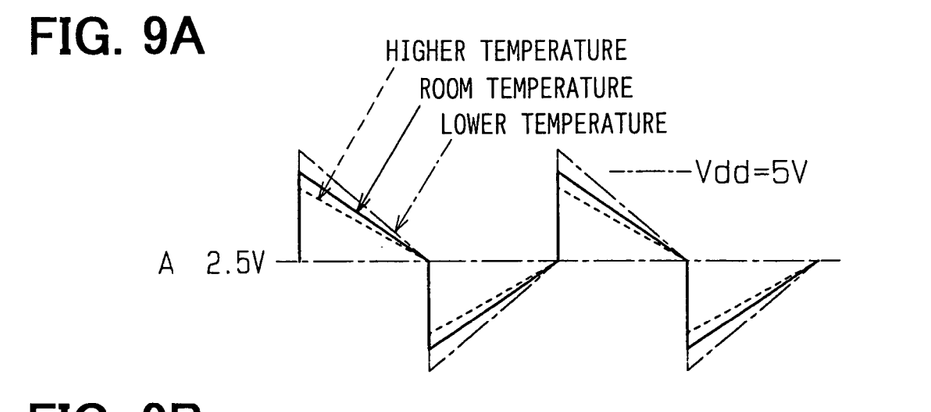
FIGS. 9A–9D are schematic diagrams illustrating waveforms at various points.
Figure 9B:
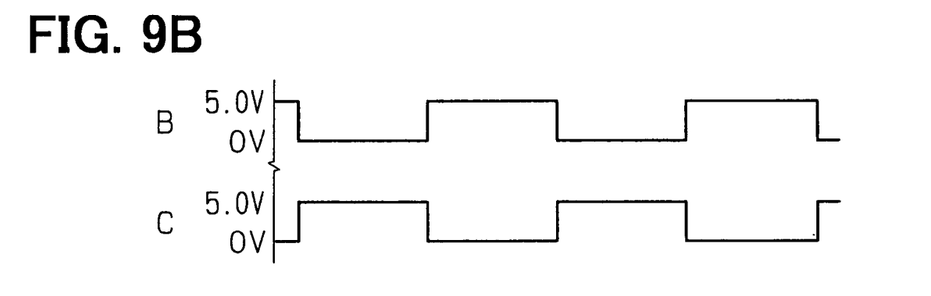
Figure 9C:
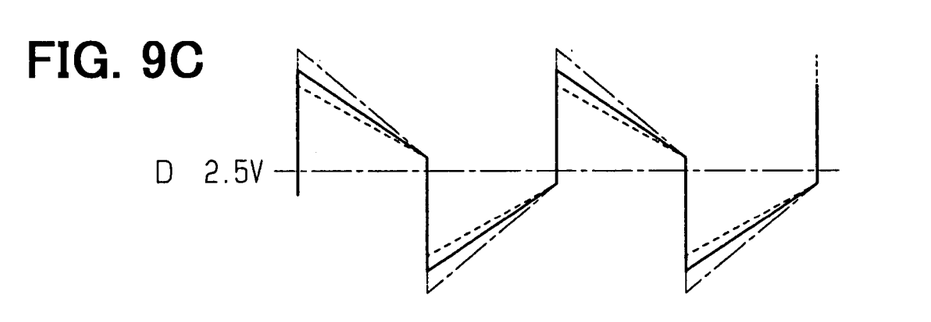
Figure 9D:
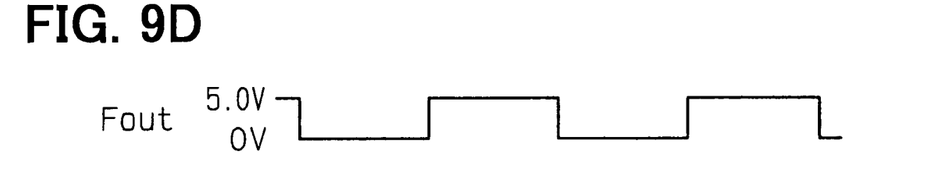

Referring to FIGS. 9A–9E, FIG. 9A shows waveforms at the input of the inverter 1 (A), FIG. 9B shows the output of inverter 1 (B), FIG. 9C shows the output of the inverter 2 (C), FIG. 9D shows the waveforms between the resistor 6 and capacitor 4 (D) and FIG. 9E shows the output of the inverter 3 (Fout). All of these waveforms are shown at a higher temperature, room temperature, and lower temperature.

For the waveform at the input of the inverter 1 (A) shown in FIG. 9A, the gradients (gradient at the time of charging/ discharging) at higher/room/lower temperatures are different one from another. The difference will be described with reference to an enlarged view of FIG. 10.

Figure 10:
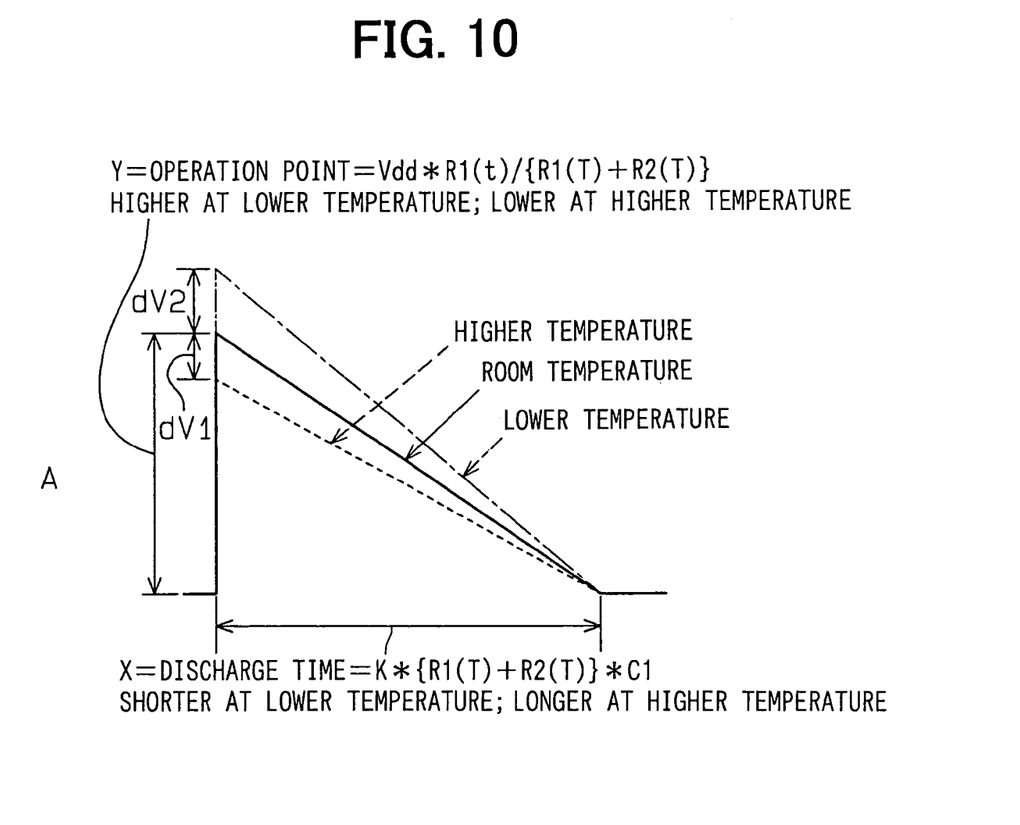
FIG. 10 is a schematic enlarged view of a portion of the waveforms.

First, the resistance of the first resistor 5 is assumed to be R1 (T), the resistance of the resistor 6 is assumed to be R2 (T), and the capacitance of the capacitor 4 is assumed to C1.

In FIG. 10, the time constant of charge/discharge may be given by $$k \cdot \{R1\ (T) + R2\ (T)\} \cdot C1.$$

The charge/discharge time constant will be smaller at a lower temperature than at the room temperature, larger at a higher temperature than the room temperature, and the charge/discharge time will be shorter at a lower temperature and longer at a higher temperature.

The charge/discharge trigger voltage (threshold point) may be given by $$Vdd \cdot R1(T)/\{R1\ (T) + R2\ (T)\}.$$

Where Vdd denotes the driving voltage (in case of FIG. 9, Vdd=5V).

The charge/discharge trigger voltage (threshold point) will be higher at a lower temperature than at the room temperature and lower at a higher temperature.

As have been described above, the resistance R1 (T) and R2 (T) of the resistors 5 and 6 which determine the oscillation frequency will be larger at a higher temperature as shown in FIG. 8 and the time constant of charge/discharge will be larger so that the charge/discharge time will be longer as shown in FIG. 10. The relationship is opposite at a lower temperature. More particularly, the resistance R1 (T) and R2 (T) will be smaller as shown in FIG. 8 and the time constant of charge/discharge will be smaller so that the charge/ discharge time will be shorter as shown in FIG. 10.

Even though the resistance R1 (T) and R2 (T) of the resistors 5 and 6 may have their temperature dependency (temperature characteristics), the charge/discharge trigger voltage (threshold point) and the charge/discharge time will be adjusted, so as to maintain a constant oscillation frequency. In practice, the impurity density in the impurity doped polysilicon resistor or diffused resistor may be optimized to adjust the charge/discharge trigger voltage of the capacitor 4 (divided voltage by two resistors 5 and 6 in FIG. 1) and the charge/discharge time so as to maintain a constant oscillation frequency.

More specifically, by controlling the impurity density the charge/discharge trigger voltage (threshold point) will be decreased by a predetermined amount (by dV1 shown in FIG. 10) for the amount that the time constant of charge/ discharge becomes larger at a higher temperature in order to maintain a constant oscillation frequency (charge/discharge time). At a lower temperature the charge/discharge trigger voltage (threshold point) will be increased by a predetermined amount (by dV2 of FIG. 10) for the amount that the time constant of charge/discharge becomes smaller in order to maintain a constant oscillation frequency (charge/discharge time). As described above, with respect to the resistors 5 and 6 that determines not only the charge/discharge time but also the charge/discharge trigger voltage (threshold point), the characteristics will be adjusted so as to maintain a constant oscillation frequency to compensate for the temperature characteristics of the oscillation frequency.

Alternatively, the charge/discharge trigger voltage and charge/discharge time of the capacitor 4 may be adjusted by using resistors of different structure for the resistors 5 and 6, by using resistors of same structure but of different impurity density or even by using resistors of different structure with their impurity density differed.

As have been described above, by adding solely one resistor (resistor 6 of FIG. 1) to the conventional circuit design shown in FIG. 18, the oscillation frequency may be maintained constant at a higher precision when the ambient temperature varies. In addition, the total dimension is small enough to facilitate integration into an LSI. This means that the oscillation frequency can be maintained constant with a simple and compact circuit design, without any large scaled integrated circuit such as the memory 119 shown in FIG. 20. Or, for an oscillator circuit built into an IC chip, as the temperature dependency (temperature characteristics) of the resistor among the temperature dependencies (temperature characteristics) on the oscillation frequency is the primary factor, the temperature dependency (temperature characteristics) may be compensated for by a simple and compact circuit design without any large scaled circuitry such as memory.

As described previously, the present preferred embodiment has following advantages:

(i) As shown in FIG. 1, in an oscillator circuit using a CR circuit for the feedback to an active circuit (1, 2, 3), a resistor 6 having a temperature coefficient θ2 (>θ1) larger than the temperature coefficient θ1 (see FIG. 8) of the resistor 5 constituting the CR circuit is integrated as the resistor for adjusting the charge/discharge trigger voltage and charge/discharge time of the capacitor 4 of the CR circuit.

(ii) More specifically, in an oscillator circuit having inverters 1, 2, 3 connected in series, a feedback supplied from the output terminal of the inverter 3 to the input terminal of the inverter 1 through the resistor 5, and a feedback supplied from the output terminal of the inverter 2 to the input terminal of the inverter 1 through a capacitor 4, a resistor 6 is inserted which has a temperature coefficient θ2 (>θ1) larger than the temperature coefficient θ1 of the resistor 5 into the feedback path from the output terminal of the inverter 2 to the input terminal of the inverter 1 through the capacitor 4. Generally, if the oscillator circuit has more than three inverters connected in series, it will include a feedback from the output terminal of the odd inverters among the inverter group (1 to 3) to the input terminal of first inverter 1 through a resistor 5, a feedback from the output terminal of at least any one of the inverters to the input terminal of the first inverter 1 through a capacitor 4 and a resistor 6 having a temperature coefficient θ2 (>θ1) larger than the temperature coefficient θ1 of the resistor 5 and that is inserted into the feedback path from the output terminal of any one of even inverters among the inverter group (1 to 3) to the input terminal of the first inverter 1 through the capacitor 4.

Therefore, for (i), the charge/discharge trigger voltage and charge/discharge time of the capacitor 4 in the CR circuit may be adjusted by using the resistor 6 having a temperature coefficient larger than the temperature coefficient of the resistor 5 constituting the CR circuit to thereby result in an improved temperature dependency with respect to the oscillation frequency with a simple arrangement. For (ii), the charge/discharge trigger voltage and charge/discharge time of the capacitor 4 may be adjusted in this circuitry to thereby result in an improved temperature dependency with respect to the oscillation frequency with a simple arrangement.

(iii) More practically, the resistors 5 and 6 are implemented by semiconductor resistor elements and the temperature coefficient of these resistors 5 and 6 may be adjusted by differing the impurity density thereof. In addition, the semiconductor resistor element may be preferably made of impurity doped polysilicon resistor or diffused resistor.

As alternatives to the circuit of FIG. 1, circuits shown in FIGS. 11, 12, 13, and 14 may also be equally used.

Figure 11:
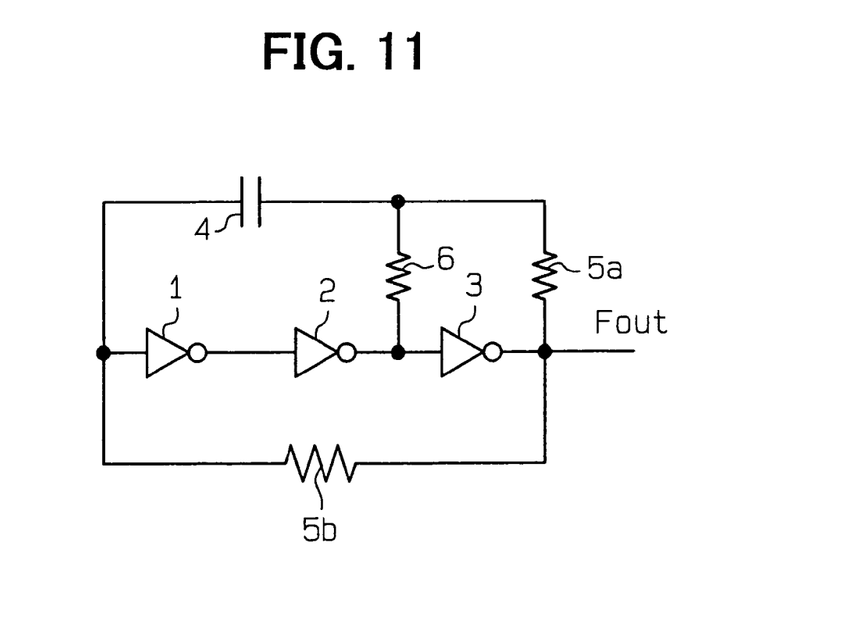
FIG. 11 is a schematic circuit diagram of an oscillator circuit of another preferred embodiment of the present invention.

In FIG. 11, three inverters 1, 2, and 3 are connected in series, a feedback is supplied from the output terminal of the third inverter 3 to the input terminal of the first inverter 1 through a resistor 5a and a capacitor 4, while another feedback is supplied from the output terminal of the inverter 3 to the input terminal of the inverter 1 through a resistor 5b. In the feedback path from the output terminal of the second inverter 2 to the input terminal of the first inverter 1 through the capacitor 4, a resistor 6 having a temperature coefficient larger than that of resistors 5a and 5b is inserted.

Figure 12:
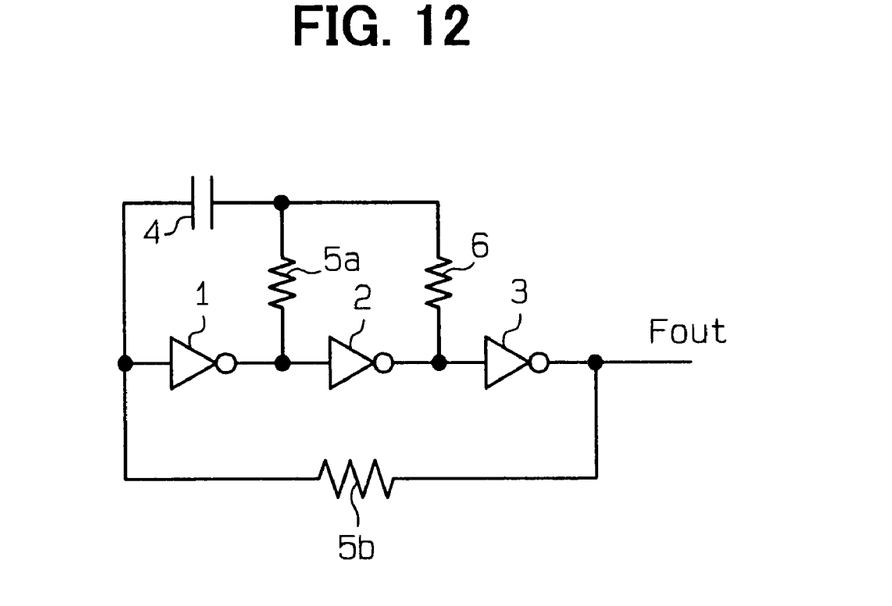
FIG. 12 is a schematic circuit diagram of an oscillator circuit of another preferred embodiment of the present invention.

The circuit diagram shown in FIG. 12 is equivalent to that of FIG. 11. In FIG. 12, three inverters 1, 2, and 3 are connected in series, a feedback is supplied from the output terminal of the first inverter 1 to the input terminal of the first inverter 1 through a resistor 5a and a capacitor 4, while another feedback is supplied from the output terminal of the third inverter 3 to the input terminal of the inverter 1 through a resistor 5b. In the feedback path from the output terminal of the second inverter 2 to the input terminal of the first inverter 1 through the capacitor 4, a resistor 6 having a temperature coefficient larger than that of resistors 5a and 5b is inserted.

Figure 13:
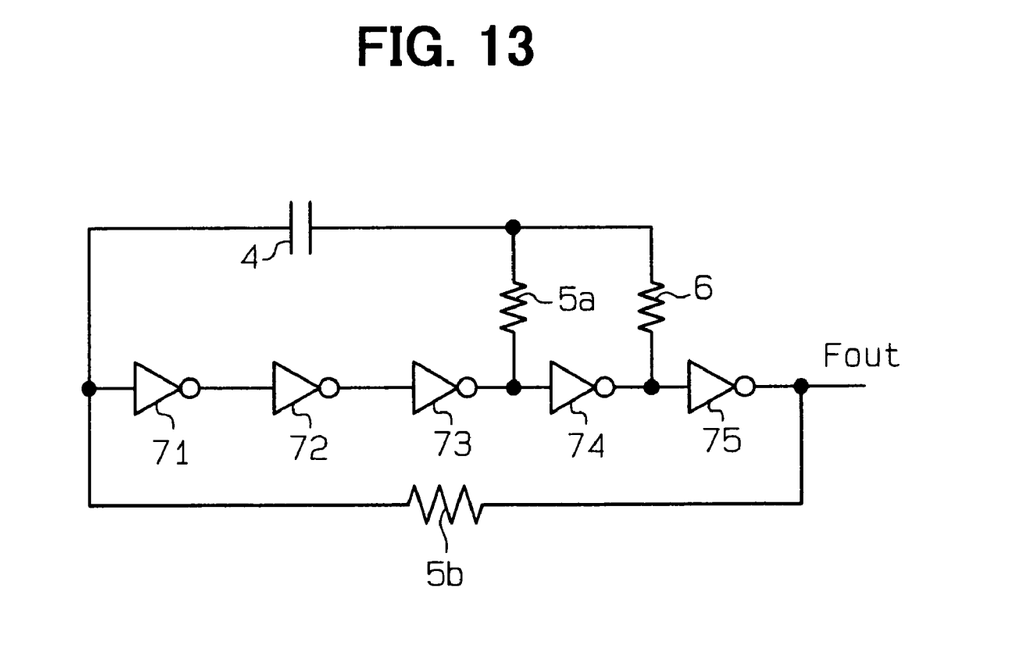
FIG. 13 is a schematic circuit diagram of an oscillator circuit of another preferred embodiment of the present invention.

In FIG. 13, five inverters 71, 72, 73, 74, and 75 are connected in series, a feedback is supplied from the output terminal of the third inverter 73 to the input terminal of the first inverter 71 through a resistor 5a and a capacitor 4. Another feedback is supplied from the output terminal of the inverter 75 to the input terminal of the inverter 71 through the resistor 5b. In addition, a resistor 6 having a temperature coefficient larger than the temperature coefficient of those resistors 5a and 5b is inserted into the feedback path from the output terminal of the fourth inverter 74 to the input terminal of the first inverter 71 through the capacitor 4.

Figure 14:
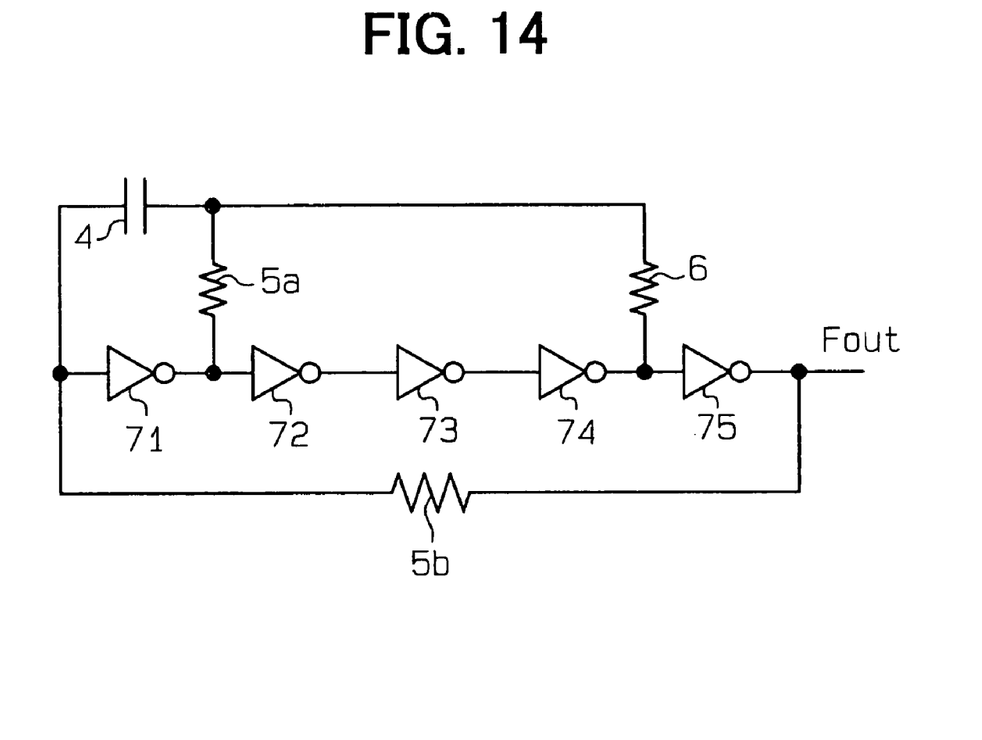
FIG. 14 is a schematic circuit diagram of an oscillator circuit of another preferred embodiment of the present invention.

In FIG. 14, five inverters 71, 72, 73, 74, and 75 are connected in series, a feedback is supplied from the output terminal of the first inverter 71 to the input terminal of the first inverter 71 through a resistor 5a and a capacitor 4. Also, another feedback is supplied from the output terminal of the fifth inverter 75 to the input terminal of the first inverter 71 through the resistor 5b. In addition a resistor 6 having a temperature coefficient larger than the temperature coefficient of these resistors 5a and 5b is inserted into the feedback path from the output terminal of the fourth inverter 74 to the input terminal of the first inverter 71 through the capacitor 4.

[Second Embodiment]

Figure 15:
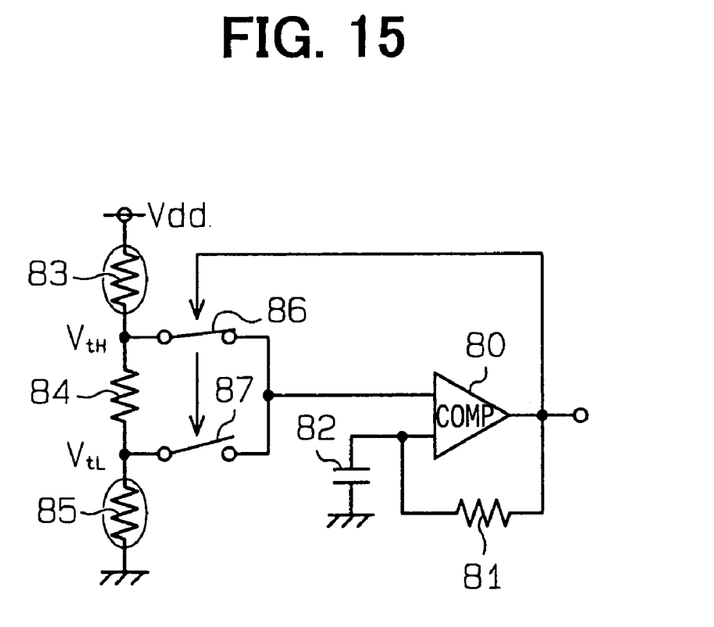
FIG. 15 is a schematic circuit diagram of an oscillator circuit of a second preferred embodiment of the present invention.

Referring to FIG. 15, a second preferred embodiment of the present invention will be described in greater details herein below.

In FIG. 15 a circuit diagram of an oscillator circuit in accordance with the preferred embodiment is shown. The oscillator circuit in accordance with the preferred embodiment is also preferably built into a chip, i.e., integrated into an IC.

In FIG. 15, the circuit includes a comparator 80 as an active element. Furthermore, a feedback circuit made of a resistor 81 and a capacitor 82 is used. This feedback circuit (CR circuit) supplies a feedback to one of input terminals (first input terminal) of the comparator 80. Three resistors 83, 84, 85 are connected in series across the power supply terminal (Vdd) and the ground. The node between the resistor 83 and the resistor 84 is connected to the other input terminal (second input terminal) of the comparator 80 through a switch 86. The threshold voltage VtH of the high voltage side is defined by the potential at the node between the resistor 83 and the resistor 84. The node between the resistor 84 and the resistor 85 is connected to the other input terminal (second input terminal) of the comparator 80 through a switch 87. The threshold voltage VtL of the low voltage side is defined by the potential at the node between the resistor 84 and the resistor 85. In such a manner, the other input terminal (second input terminal) of the comparator 80 is applied with voltages divided by three resistors 83, 84, and 85. The output terminal of the comparator 80 turns switches 86 and 87 on and off alternatively. The input terminal (second input terminal) of the comparator 80 will be applied alternately with the threshold voltage of high voltage side VtH and the threshold voltage of low voltage side VtL.

In the circuit above, the temperature coefficient of the resistors 83 and 85 are set to be larger than the temperature coefficient of the resistor 84 and the resistor 81 constituting the CR circuit. More specifically, the resistors 83, 84, 85, 81 may be made of impurity doped polysilicon resistors as shown in FIG. 2, or of diffused resistors shown in FIG. 3, FIG. 5, and FIG. 6. By changing the impurity density of the resistors 83 and 85 from the impurity density of the resistor 84 and resistor 81, the temperature coefficient of the resistors 83 and 85 may be set to be larger than that of the resistors 84 and 81.

Figure 16:
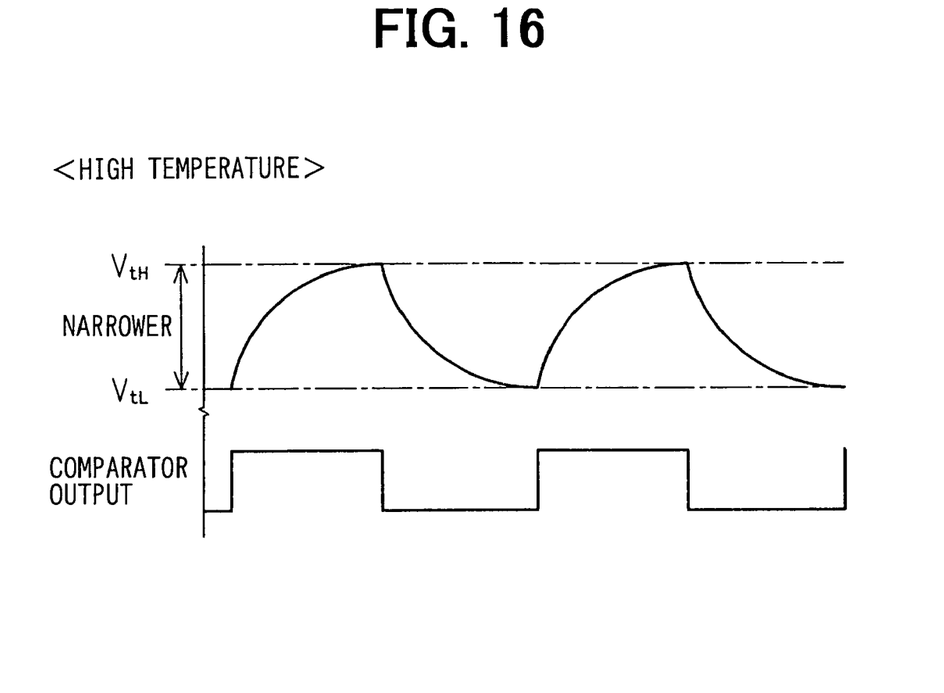
FIG. 16 is a schematic diagram illustrating waveforms.
Figure 17:
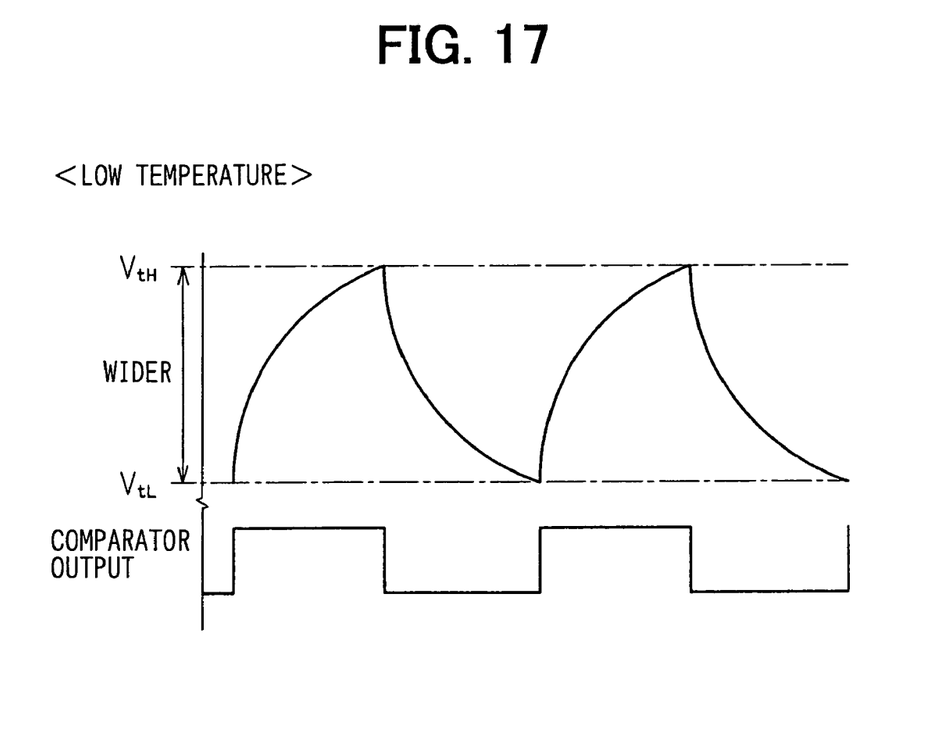
FIG. 17 is a schematic diagram illustrating waveforms.

In this way at a higher temperature as shown in FIG. 16, the span between the threshold voltage of high voltage side VtH and the threshold voltage of low voltage side VtL may be narrowed, while at a lower temperature as shown in FIG. 17 the span between the threshold voltage of high voltage side VtH and the threshold voltage of low voltage side VtL may be widened so as to control the oscillator frequency (charge/discharge time) to be constant. In this manner the charge discharge time and charge/discharge trigger voltage at the charge/discharge operation by the capacitor 82 shown in FIG. 15 may be adjusted.

Alternatively, the charge/discharge trigger voltage and charge/discharge time of the capacitor 82 may be adjusted by using resistors of different structure for the resistors 81, 83, 84, and 85, by using resistors of similar structure but of different impurity density, or even by using resistors of different structure but with their impurity density differed.

As an improvement to the circuit shown in FIG. 20, the oscillation frequency may be maintained constant when temperature varies, without the need of the thermistor 118 or the memory 119, by a simple and compact circuit design.

As described previously, the present preferred embodiment has following advantages:

(i) As shown in FIG. 15, in an oscillator circuit using a CR circuit for the feedback to an active circuit of the comparator 80, the resistors 83 and 85 having a temperature coefficient larger than the temperature coefficient of the resistor 81 constituting the CR circuit is integrated as the resistors for adjusting the charge/discharge trigger voltage (Vth, Vtl) and charge/discharge time of the capacitor 82 of the CR circuit.

(ii) More specifically, in an oscillator circuit having a feedback to one of input terminals of the comparator 80 applied through a CR circuit of a capacitor 82 and resistor 81, and a voltage divided by a plurality of resistors 83, 84, and 85 and applied to the other input terminal of the comparator 80, the temperature coefficient of some resistors 83 and 85 among a plurality of divider resistors 83, 84, and 85 are set to be larger than the temperature coefficient of the remaining divider resistor 84 and the resistor 81 of the CR circuit.

For (i), the charge/discharge trigger voltage and charge/discharge time of the resistor 82 of the CR circuit may be adjusted by using the resistors 83 and 85 having a temperature coefficient larger than the temperature coefficient of the resistor 81 of the CR circuit, thereby resulting in an improvement of temperature dependency with respect to the oscillation frequency with a simple circuit design. Also, the charge/discharge trigger voltage and charge/discharge time of the capacitor 82 may be adjusted by (ii), thereby resulting in an improvement of temperature dependency with respect to the oscillation frequency with a simple circuit design.

Also in this preferred embodiment, the resistors 81, 83, 84, 85 are made of semiconductor resistor elements, and the temperature coefficient of the resistors 81 and 84 may be differed from that of the resistors 83 and 85 by varying the impurity density of those semiconductor resistor elements. The semiconductor resistor element may be preferably of impurity doped polysilicon or diffusion resistor.

Therefore, the present invention provides an oscillator circuit comprised of a CR circuit for providing a feedback circuit to an active device (such as inventors 1 to 3, 71 to 75 or the comparator 81), wherein the CR circuit is comprised of a first resistor group (5, 5a, 5b, 81) and a capacitor (4, 82). The oscillator circuit also includes a second resistor group (6, 83, 85) comprised of one or more resistors, wherein the second resistor group (6, 83, 85) is for adjusting a charge/discharge trigger voltage and a charge/discharge time associated with the capacitor (4, 82) of the CR circuit. The second resistor group (6, 83, 85) has a temperature coefficient that is larger than a temperature coefficient associated with the first resistor group (5, 5a, 5b, 81). The first resistor group (5, 5a, 5b, 81) and the second resistor group (6, 83, 85) are preferably semiconductor resistor elements in which the impurity density is changed to vary the their respective temperature coefficients. The semiconductor resistor elements may be comprised of impurity doped polysilicon resistor or diffused resistor. The oscillator circuit is preferably integrated in one chip.

The active device may be comprised of three inverters (1 to 3, 71 to 75) connected in series. Generally, a feedback path is preferably connected from an output terminal of an odd number inverter of the three inverters (1 to 3, 71 to 75) through a first resistor (5, 5a, 5b) to an input terminal of the first inverter (1, 71) of the more than three inverters. Another feedback path is connected from an output terminal of an even numbered inverter of the plurality of inverters (1 to 3, 71 to 75) through a capacitor (4) and a second resistor (6) to the input terminal of the first inverter (1, 71). The second resistor (6) has a temperature coefficient larger than a temperature coefficient of the first resistor (5, 5a, 5b).

In a second preferred embodiment, the oscillator circuit comprises a CR circuit and a divider. The CR circuit is comprised of a capacitor (82) and a resistor (81) and is coupled to an input terminal of a comparator (80). The divider is comprised of a plurality of resistors (83, 84, 85). The divider applies a voltage to another input terminal of the comparator (80) after the voltage has been divided by the plurality of resistors (83, 84, 85). Among the plurality of resistors (83, 84, 85), a first group of resistors (83, 85) has a temperature coefficient larger than a temperature coefficient of the remaining resistor (84) of the plurality of resistors (83, 84, 85). Also, the temperature coefficient of the first group of resistors (83, 85) is also larger than a temperature coefficient of the resistor (81) of the CR circuit.

The resistor (81) of the CR circuit and the plurality of resistors (83, 84, 85) of the divider are preferably semiconductor resistor elements comprised of impurity doped polysilicon resistor or diffused resistor. The temperature coefficient of the resistor (81) of the CR circuit and the temperature coefficient of the plurality of resistors (83, 84, 85) of the divider are varied by changing an impurity density of the semiconductor resistor elements. The oscillator circuit is preferably integrated in one chip.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An oscillator circuit comprising:
   a CR circuit for providing a feedback circuit to an active device, wherein the CR circuit comprises a first resistor group and a capacitor; and
   a second resistor group comprising one or more resistors, wherein the second resistor group adjusts a charge/discharge trigger voltage and a charge/discharge time associated with the capacitor of the CR circuit, wherein the second resistor group has a positive temperature coefficient that is larger than a positive temperature coefficient associated with the first resistor group.

2. The oscillator circuit of claim 1, wherein the first resistor group and the second resistor group are semiconductor resistor elements.

3. The oscillator circuit of claim 2, wherein the temperature coefficients of the first resistor group and the second resistor group are varied by changing an impurity density of the semiconductor resistor elements.

4. The oscillator circuit of claim 2, wherein the semiconductor resistor elements are composed of one of an impurity doped polysilicon resistor and a diffused resistor.

5. The oscillator circuit of claim 1, wherein the oscillator circuit is integrated in one chip.

6. An oscillator circuit comprising:
   a plurality of inverters connected in series;
   a first resistor connected between an input terminal of a first inverter of the plurality of inverters and an output terminal of an odd number inverter of the plurality of inverters; and
   a second resistor connected to the input terminal of the first inverter and to an output terminal of an even numbered inverter of the plurality of inverters through a capacitor, the second resistor adjusting a charge/discharge trigger voltage and a charge/discharge time associated with the capacitor, the second resistor having a positive temperature coefficient that is larger than a positive temperature coefficient associated with the first resistor.

7. The oscillator circuit of claim 1, wherein the active device includes at least one inverter.

8. The oscillator circuit of claim 1, wherein the active device includes three or more inverters connected in series.

9. The oscillator circuit of claim 1, wherein:
   the first resistor group includes one or more impurity doped polysilicon resistors; and
   the one or more resistors of the second resistor group include one or more $p^+$-type diffused resistors.

10. The oscillator circuit of claim 1, wherein:
    the first resistor group includes at least one impurity doped polysilicon resistor; and
    the one or more resistors of the second resistor group include one or more p-type well diffused resistors.

11. The oscillator circuit of claim 1, wherein:
    the first resistor group includes at least one $p^+$-type diffused resistor; and
    the one or more resistors of the second resistor group include one or more p-type well diffused resistors.

12. The oscillator circuit of claim 1, wherein:
    the first resistor group includes at least one $p^+$-type diffused resistor; and
    the one or more resistors of the second resistor group include one or more n-type well diffused resistors.

* * * * *